(12) United States Patent
Harada et al.

(10) Patent No.: US 12,154,264 B2
(45) Date of Patent: Nov. 26, 2024

(54) DEFECT INSPECTING SYSTEM AND DEFECT INSPECTING METHOD

(71) Applicant: HITACHI HIGH-TECH CORPORATION, Tokyo (JP)

(72) Inventors: Minoru Harada, Tokyo (JP); Naoaki Kondo, Tokyo (JP); Yohei Minekawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 413 days.

(21) Appl. No.: 17/781,473

(22) PCT Filed: Dec. 24, 2019

(86) PCT No.: PCT/JP2019/050505
§ 371 (c)(1),
(2) Date: Jun. 1, 2022

(87) PCT Pub. No.: WO2021/130839
PCT Pub. Date: Jul. 1, 2021

(65) Prior Publication Data
US 2023/0052350 A1 Feb. 16, 2023

(51) Int. Cl.
*G06T 7/00* (2017.01)
*G06V 10/74* (2022.01)

(52) U.S. Cl.
CPC ............ *G06T 7/001* (2013.01); *G06T 7/0008* (2013.01); *G06V 10/761* (2022.01);
(Continued)

(58) Field of Classification Search
CPC .................. G06T 7/001; G06T 7/0008; G06T 2207/20084; G06T 2207/30148; G06T 2207/30168; G06V 10/761
(Continued)

(56) References Cited

U.S. PATENT DOCUMENTS

2001/0036306 A1\* 11/2001 Wienecke ........ G01N 21/95607
382/149
2013/0140457 A1 6/2013 Minekawa et al.
(Continued)

FOREIGN PATENT DOCUMENTS

JP 2001-085482 A 3/2001
JP 2011-145275 A 7/2011
(Continued)

OTHER PUBLICATIONS

Taiwanese Office Action corresponding Taiwanese Application No. 109141069 dated Aug. 3, 2021.
(Continued)

*Primary Examiner* — Allen H Nguyen
(74) *Attorney, Agent, or Firm* — MATTINGLY & MALUR, PC

(57) ABSTRACT

A defect inspecting system includes a detector configured to image a sample and a host control device that acquires an inspection image including a defect and a plurality of reference images not including a defect site and generates a pseudo defect image by editing a predetermined reference image among the plurality of acquired reference images. An initial parameter is determined with which the pseudo defect site is detectable from the pseudo defect image. The host control device acquires a defect candidate site from the inspection image using the initial parameter, estimates a high-quality image from an image of a site corresponding to the defect candidate site using the parameter acquired in image quality enhancement, and specifies an actual defect site in the inspection image by executing defect discrimination. A parameter is determined with which a site close to the specified actual defect site is detectable using the inspection image.

9 Claims, 14 Drawing Sheets

(52) U.S. Cl.
 CPC ............... *G06T 2207/20084* (2013.01); *G06T 2207/30148* (2013.01); *G06T 2207/30168* (2013.01)

(58) Field of Classification Search
 USPC ........................................................ 382/149
 See application file for complete search history.

(56) References Cited

U.S. PATENT DOCUMENTS

| | | |
|---|---|---|
| 2015/0332445 A1 | 11/2015 | Harada et al. |
| 2015/0379707 A1 | 12/2015 | Tsuchiya et al. |
| 2016/0013015 A1* | 1/2016 | Potocek ............... G02B 21/008 250/307 |
| 2017/0213355 A1* | 7/2017 | Hujsak ...................... G06T 5/77 |
| 2018/0240225 A1 | 8/2018 | Harada et al. |
| 2018/0266968 A1* | 9/2018 | Hirai ........................ G06T 7/001 |
| 2021/0114368 A1* | 4/2021 | Ukishima ............... G06N 3/084 |

FOREIGN PATENT DOCUMENTS

| | | |
|---|---|---|
| JP | 2014-145694 A | 8/2014 |
| JP | 2018-137275 A | 8/2018 |
| TW | 201009326 A | 3/2010 |
| TW | 201612624 A | 4/2016 |
| WO | 2014/119124 A1 | 8/2014 |

OTHER PUBLICATIONS

International Search Report of PCT/JP2019/050505 dated Apr. 7, 2020.

\* cited by examiner

[FIG. 1]
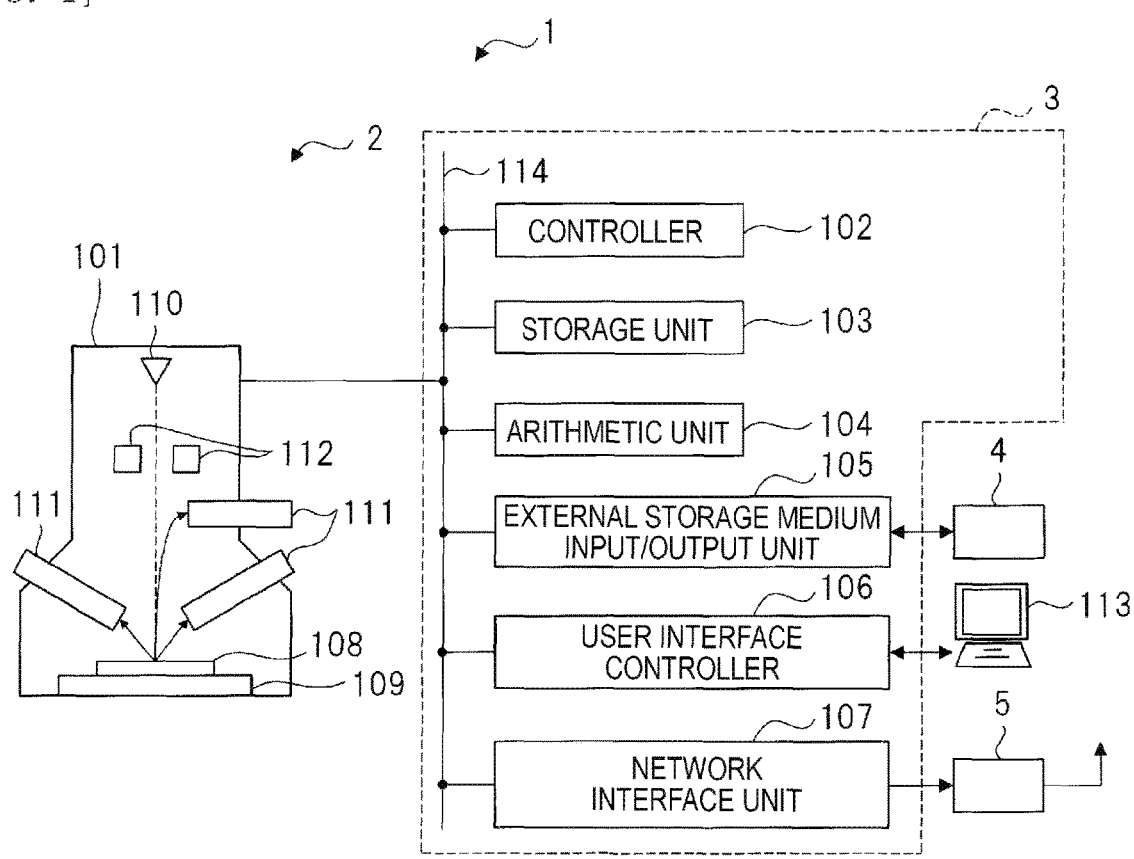

[FIG. 2]
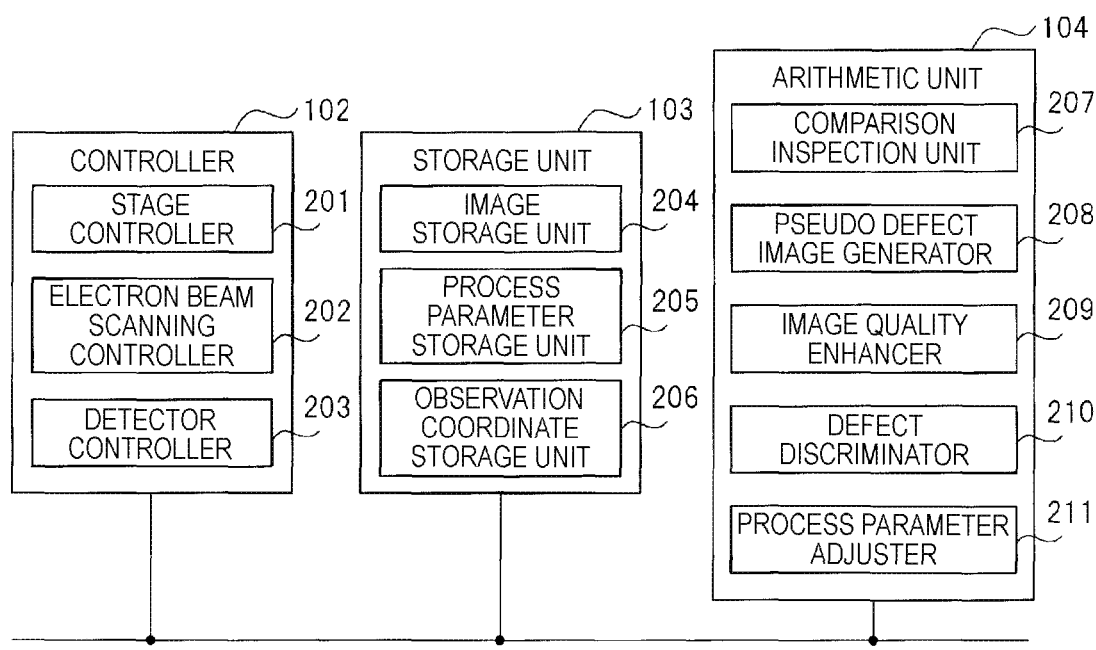

[FIG. 3]
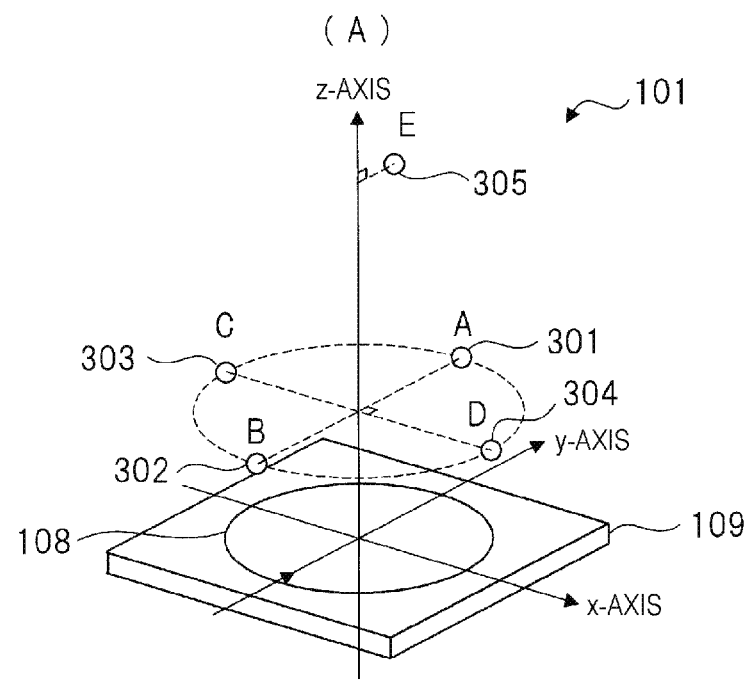
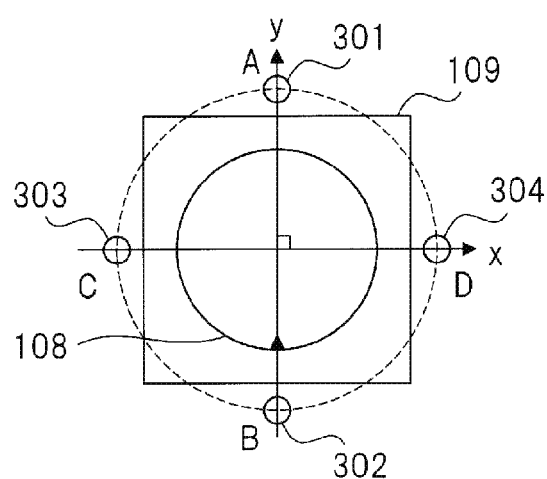
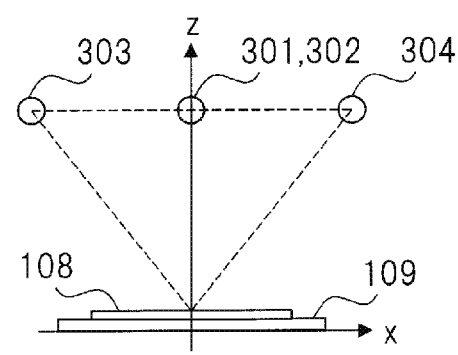

[FIG. 4]
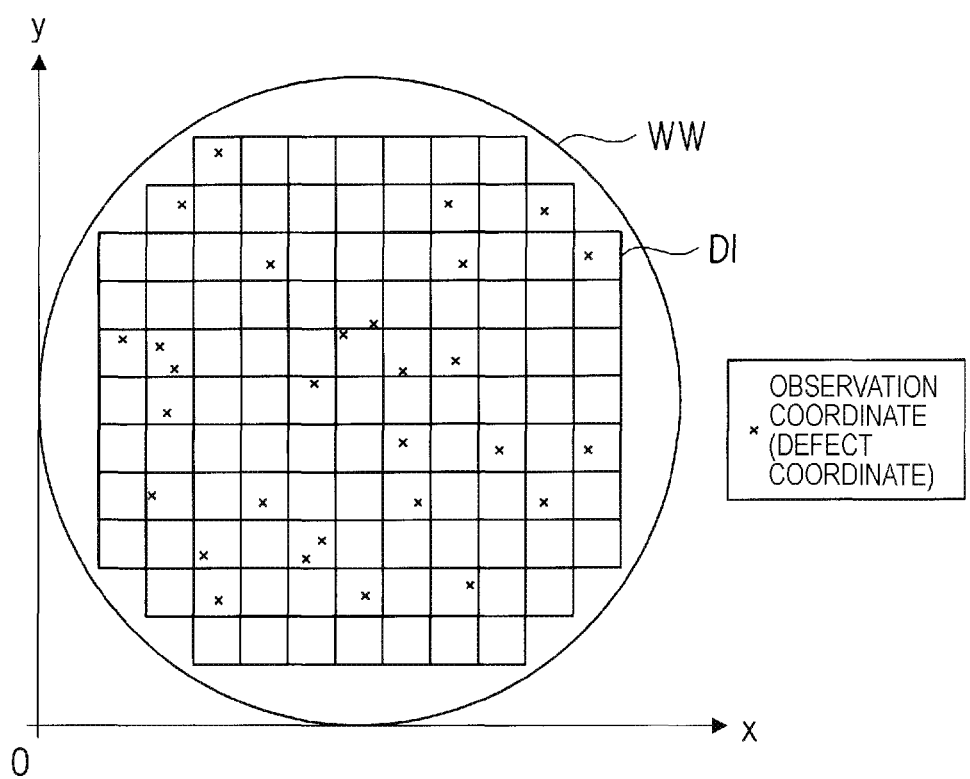

[FIG. 5]
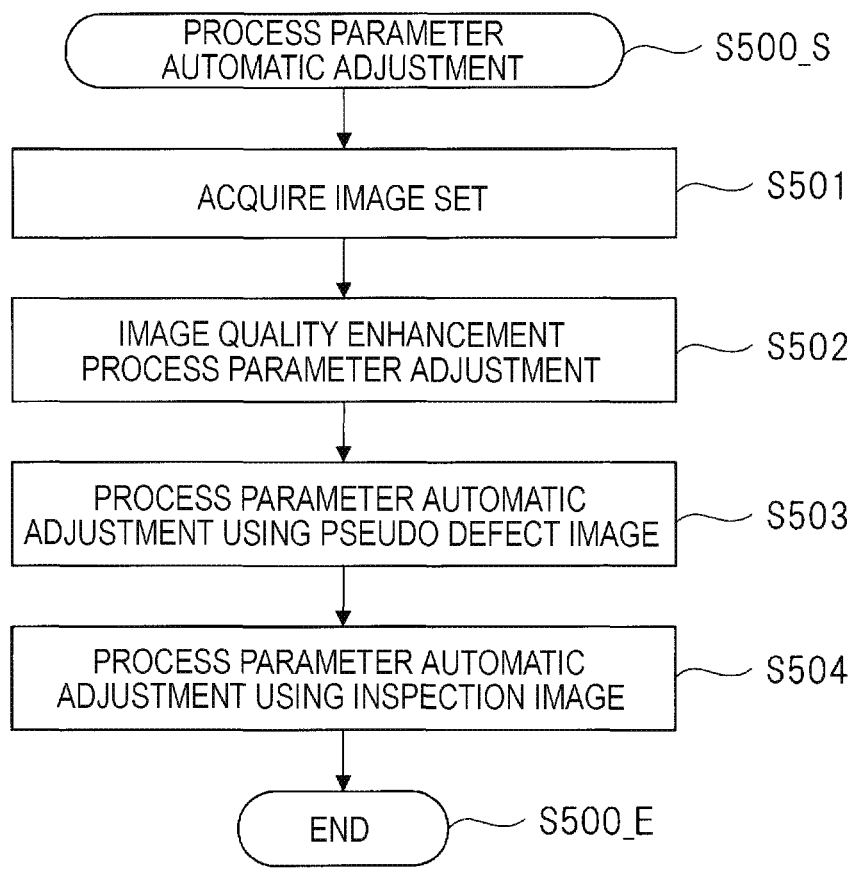

[FIG. 6]
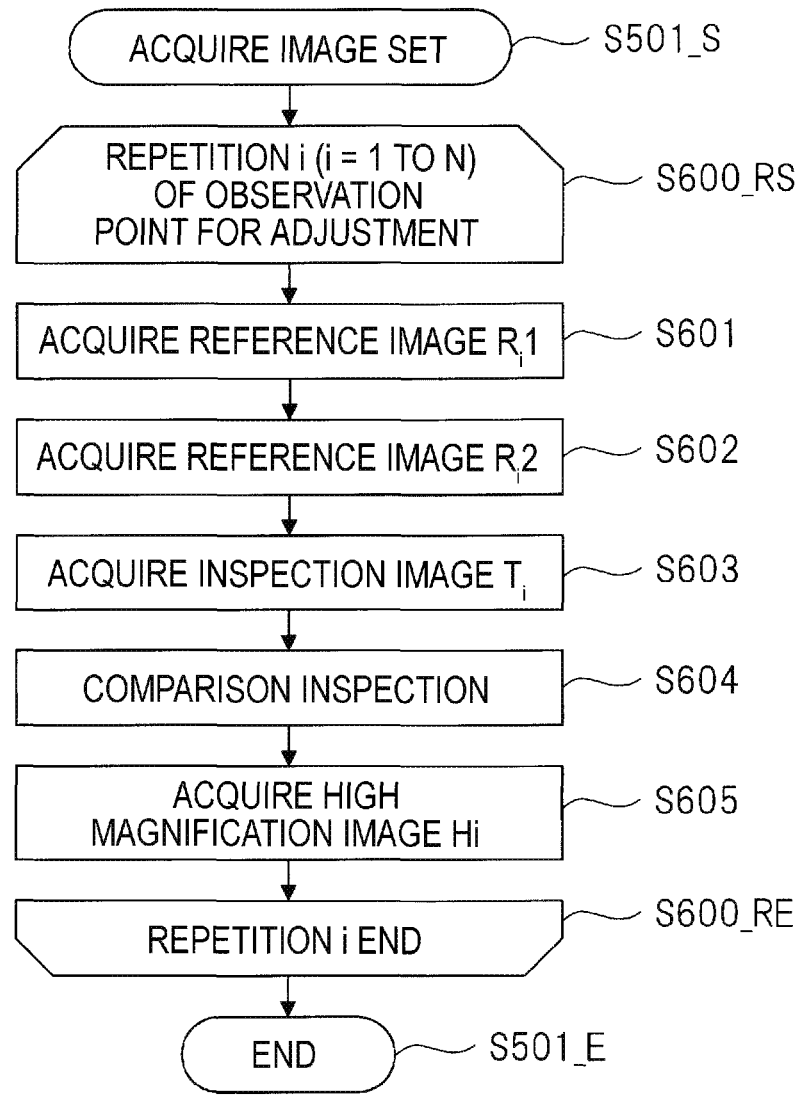
[FIG. 7]
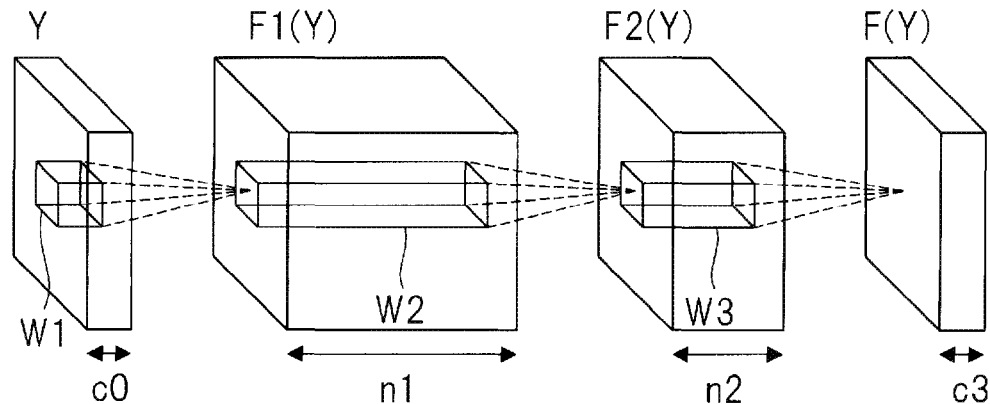

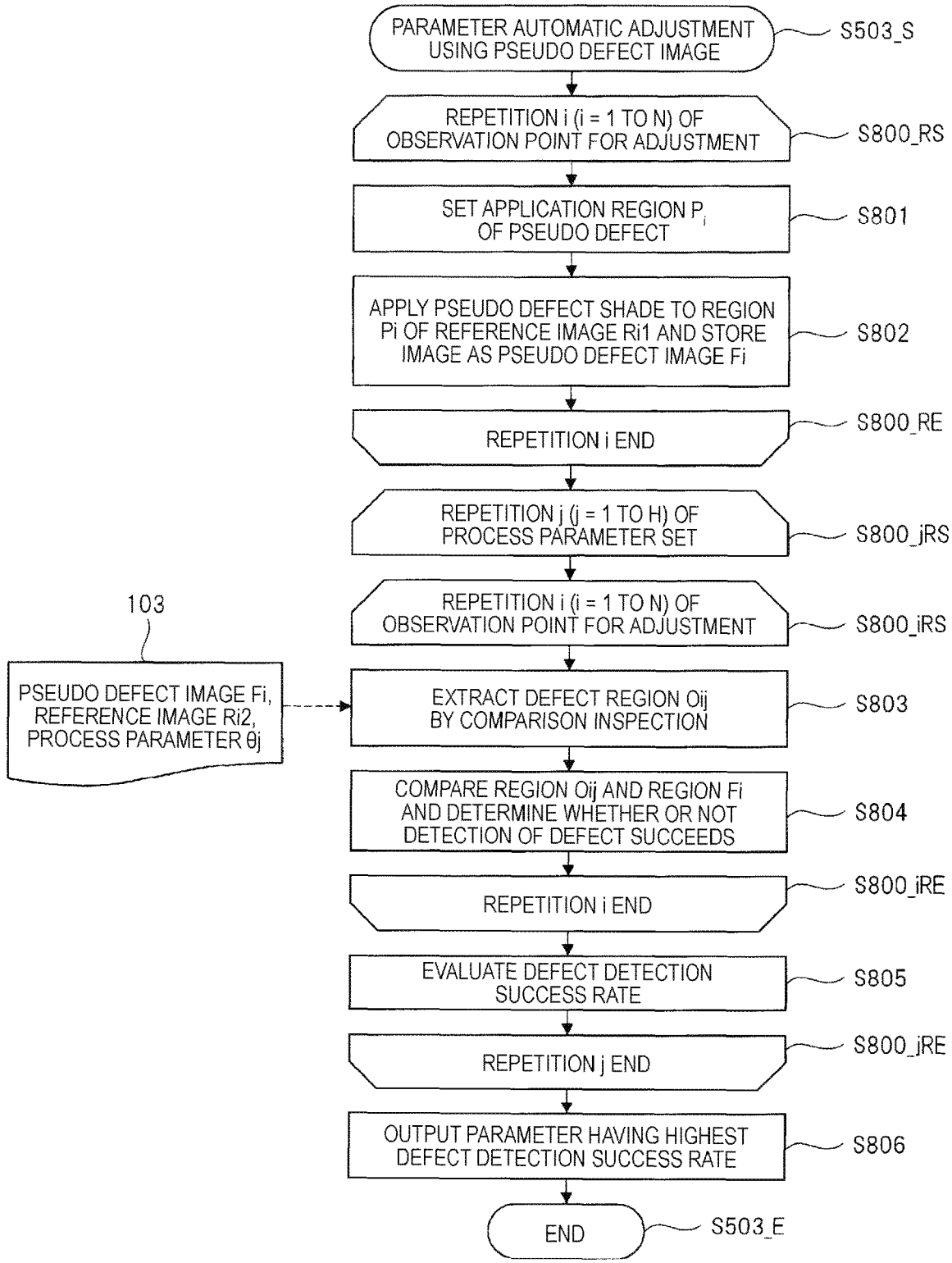

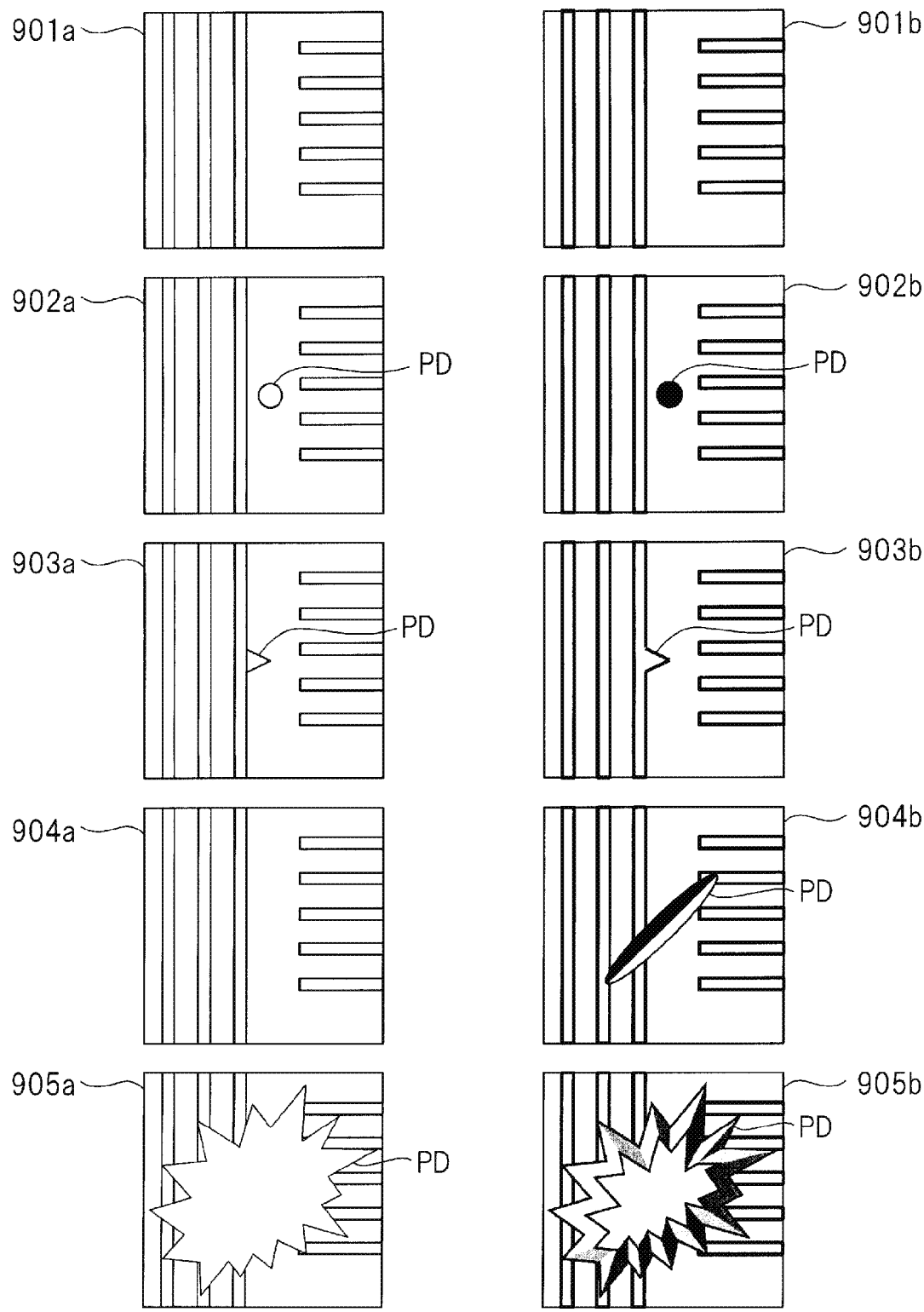
[FIG. 9]

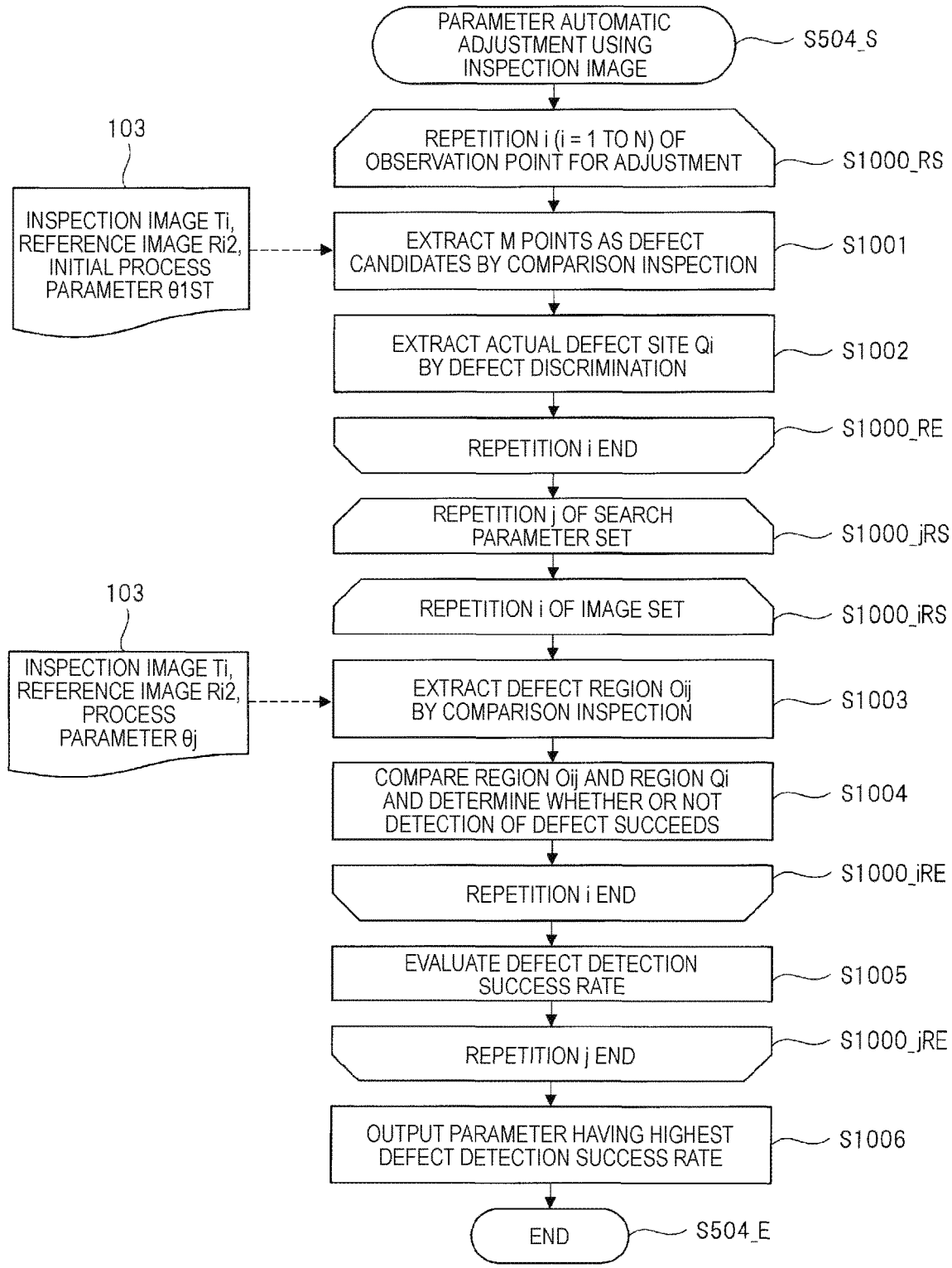
[FIG. 10]

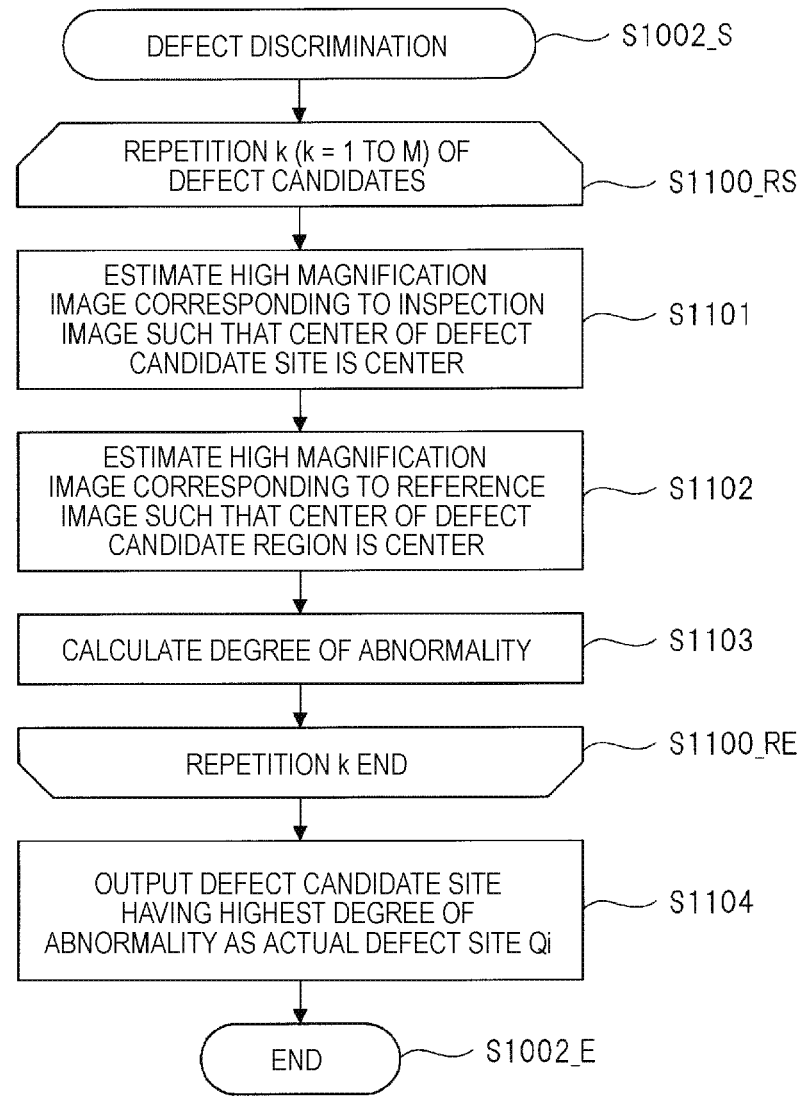
[FIG. 11]

[FIG. 12]
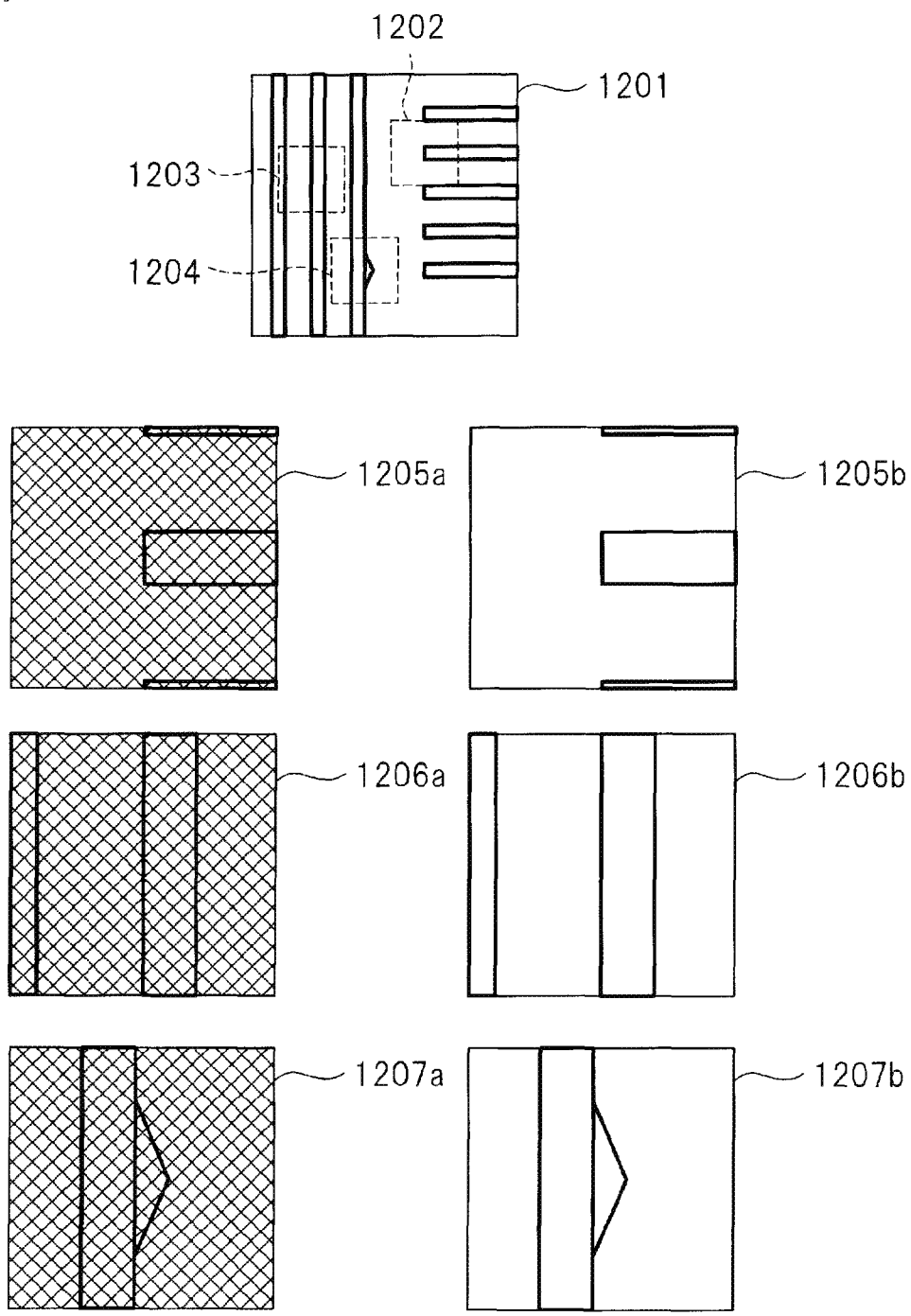

[FIG. 13]
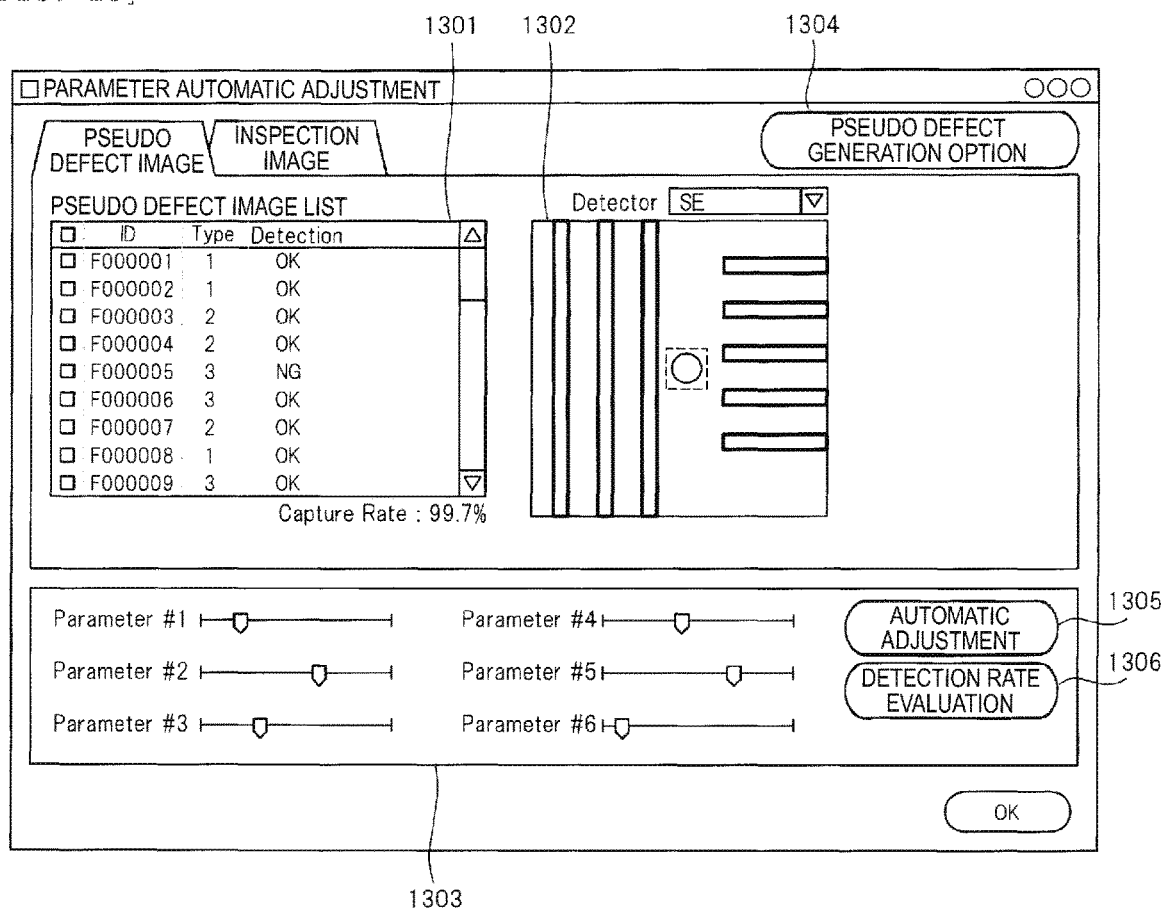

[FIG. 14]
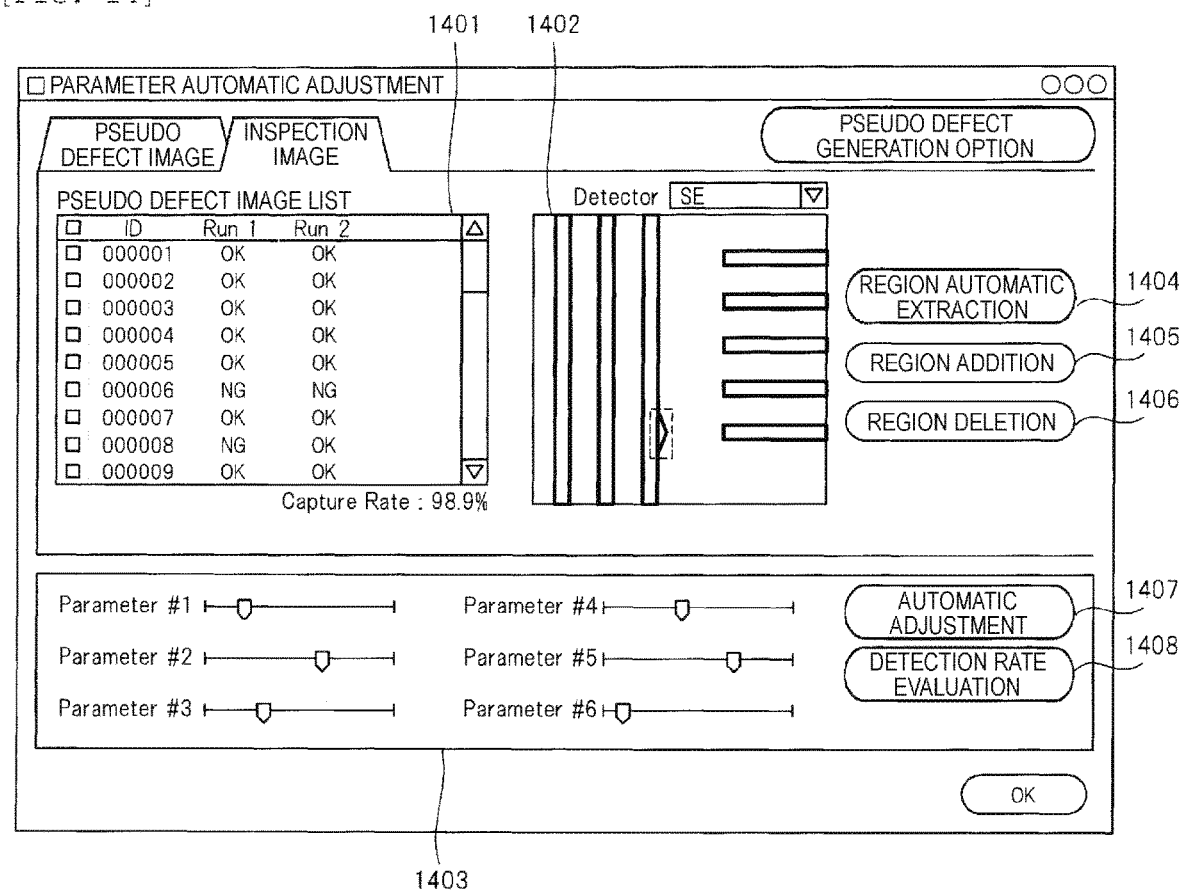

[FIG. 15]
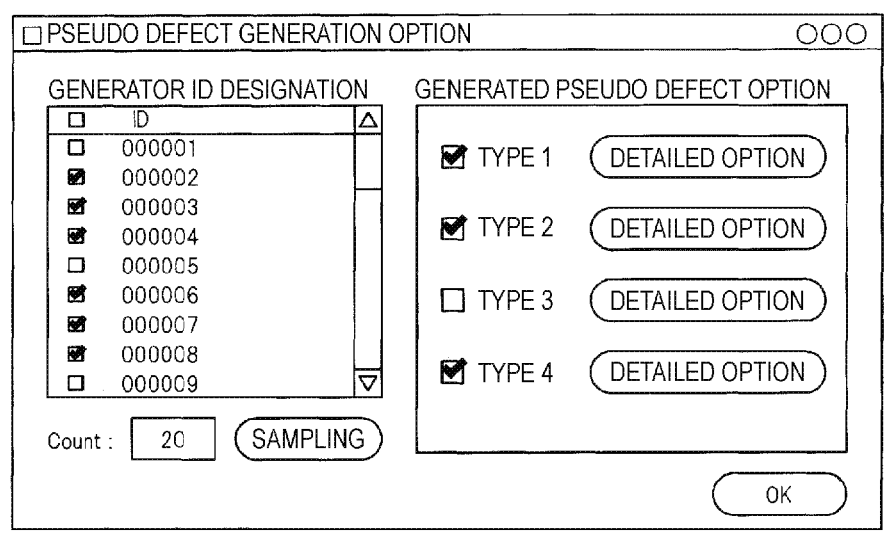

DEFECT INSPECTING SYSTEM AND DEFECT INSPECTING METHOD

TECHNICAL FIELD

The present invention relates to a defect inspecting system and a defect inspecting method for inspecting defects, for example, in a semiconductor wafer.

BACKGROUND ART

In the manufacture of a semiconductor wafer, in order to secure a profit, it is important to start a process for manufacturing the semiconductor wafer rapidly and to shift to mass production with a high yield at an early stage. To that end, various inspection devices, observation devices, measurement devices, and the like are introduced into manufacturing lines.

For example, in an inspection device, defects in a semiconductor wafer are inspected, and coordinate information representing positions (sites) of defects in the semiconductor wafer as a sample are output from the inspection device as defect coordinates. The defect coordinates output from the inspection device are supplied to a defect observation device as an observation device that observes defects. In the defect observation device, the defect positions in the semiconductor wafer are imaged with high resolution based on the defect coordinates, and the acquired images are output. As the defect observation device, an observation device (hereinafter, also referred to as "review SEM") using a scanning electron microscope (hereinafter, also referred to as "SEM") is widely used.

In the observation work using the review SEM, automation on the mass production line of semiconductor wafers is desired. In this case, the review SEM is equipped with: automatic defect review (hereinafter, referred to as "ADR") of automatically collecting images at defect positions in a sample; and automatic defect classification (hereinafter, referred to as "ADC") of automatically classifying the collected defect images. As a result, the classified defect images can be automatically acquired.

The defect coordinates output from the inspection device include an error. In the ADR, an image is acquired in a wide field of view centering on a defect coordinate supplied from the inspection device, and a defect is redetected from this acquired image. In the ADR, a defect site acquired by the redetection is imaged at a high magnification, and the high-resolution image is output as an image for observation. As a method of detecting a defect from an image (inspection image) acquired by the SEM, a method of detecting a defect by acquiring an image of a region where the same circuit pattern as a defect site is formed as a reference image and comparing an inspection image of the defect site to the reference image is known.

In addition, as a method of automatically adjusting a process parameter relating to the detection in the ADR, JP-A-2011-145275 (PTL 1) describes a method of searching for a process parameter with which a defect site instructed by a user in advance is detectable. In addition, JP-A-2014-145694 (PTL 2) describes a method of searching for a process parameter capable of discriminating between a defect and a nuisance with high accuracy using an inspection image of a defect site and a plurality of reference images.

CITATION LIST

Patent Literature

PTL 1: JP-A-2011-145275
PTL 2: JP-A-2014-145694

SUMMARY OF INVENTION

Technical Problem

In order to improve device performance or to reduce manufacturing costs in the manufacture of semiconductors, an attempt to increase the integration density has been continuously made, and reduction in the dimension of a circuit pattern formed on a semiconductor wafer has progressed. Accordingly, the dimension of a defect that is fatal to an operation of a device tends to decrease. Therefore, in the review SEM, it is also required to redetect a fine defect to acquire an image for observation without missing the defect. In addition, various manufacturing processes of a semiconductor are present, and thus the external appearances of defects or circuit patterns are various. Therefore, in order to detect a fine defect, it is important to adjust a process parameter relating to the detection according to characteristics of a semiconductor wafer as an observation target. However, in order to adjust the process parameter relating to the detection, in general, trial and error is required, which causes an increase in the workload of a user. In addition, the result of the process parameter adjustment depends on the skill level of the user. Therefore, when a user having a low skill level adjusts the process parameter, the defect detection rate may decrease.

PTL 1 describes the method of searching for a process parameter with which a defect site is detectable. However, the defect site needs to be instructed by a user in advance. On the other hand, PTL 2 describes the method of accurately detecting a defect site in an inspection image by comparing a plurality of reference images and the inspection image. However, when the SNR (Signal to Noise Ratio) of the inspection image and/or the reference image is low, the defect site cannot be always extracted with high accuracy.

That is, in order to fully automatically adjust a process parameter relating to detection of a defect, it is important to automatically extract a defect site in an inspection image with high accuracy without depending on SNR. However, both of PTLs 1 and 2 do not describe this problem.

An object of the present invention is to provide a defect inspecting system and a defect inspecting method in which a process parameter relating to detection of a defect can be fully automatically adjusted.

The above-described object, other objects, and new characteristics of the present invention will be clarified with reference to description of the specification and the accompanying drawings.

Solution to Problem

The summary of a representative invention disclosed in the present application will be simply described as follows.

A defect inspecting system includes: a defect inspection device including a detector configured to image a sample; and a host control device. Here, the host control device causes the defect inspection device to acquire an inspection image including a defect and causes the defect inspection device to acquire a plurality of reference images not including a defect site, generates a pseudo defect image by editing a predetermined reference image among the plurality of acquired reference images such that the edited reference image includes a pseudo defect site, and determines an initial parameter with which the pseudo defect site is detectable from the pseudo defect image. In addition, the host control device acquires a defect candidate site from the inspection image using the initial parameter, estimates a high-quality image from an image of a site corresponding to the defect candidate site in each of the inspection image and the reference image, specifies an actual defect site in the inspection image by executing defect discrimination using the estimated high-quality images in the inspection image and the reference image, and determines a parameter with which a site close to the specified actual defect site is detectable.

Advantageous Effects of Invention

The summary of an effect obtained by the representative embodiment of the present invention disclosed in the present application will be simply described as follows.

That is, according to the representative embodiment of the present invention, it is possible to provide a defect inspecting system and a defect inspecting method in which a process parameter relating to detection of a defect can be fully automatically adjusted.

BRIEF DESCRIPTION OF DRAWINGS

FIG. 1 is a block diagram illustrating a configuration of a defect inspecting system according to an embodiment.

FIG. 2 is a diagram illustrating a configuration that is implemented by a controller, a storage unit, and an arithmetic unit according to the embodiment.

FIG. 3 (A) to (C) of FIG. 3 are diagrams schematically illustrating disposition of a detector in a SEM according to the embodiment.

FIG. 4 is a diagram schematically illustrating an example of defect coordinates in a semiconductor wafer detected by a detection device.

FIG. 5 is an overall flowchart illustrating processes of a process parameter adjustment method according to the embodiment.

FIG. 6 is a flowchart illustrating processes that are executed in an image set acquisition step according to the embodiment.

FIG. 7 is a diagram illustrating an image quality enhancement process parameter adjustment step according to the embodiment.

FIG. 8 is a flowchart illustrating processes that are executed in a process parameter automatic adjustment step using a pseudo defect image according to the embodiment.

FIG. 9 is a diagram schematically illustrating examples of the pseudo defect image according to the embodiment.

FIG. 10 is a flowchart illustrating processes that are executed in a process parameter automatic adjustment step using an inspection image according to the embodiment.

FIG. 11 is a flowchart illustrating processes in a step of extracting an actual defect site by defect discrimination according to the embodiment.

FIG. 12 is a schematic diagram illustrating the extraction of the actual defect site according to the embodiment.

FIG. 13 is a screen of a GUI relating to the process parameter adjustment using the pseudo defect image according to the embodiment.

FIG. 14 is a screen of a GUI relating to the process parameter adjustment using the inspection image according to the embodiment.

FIG. 15 is a screen of a GUI for adjusting a process parameter relating to generation of the pseudo defect image according to the embodiment.

DESCRIPTION OF EMBODIMENTS

Hereinafter, a best mode for implementing the present invention will be described in detail based on the drawings. In each of the diagrams for describing the best mode of the present invention, members having the same functions are represented by the same reference numerals, and the description thereof will not be repeated.

Hereinafter, a defect inspecting system will be described using, as an example, a system (semiconductor wafer defect inspecting system) that inspects a defect in a semiconductor wafer as a sample. In addition, an embodiment will be described using a defect observation device (semiconductor wafer defect observation device) in the semiconductor wafer defect inspecting system as an example. The defect inspecting system includes an imaging device that images a sample based on defect coordinates output from the inspection device. In the following description, a case where a SEM is used as the imaging device will be described. However, the imaging device in the defect inspecting system is not limited to the SEM, and may be an imaging device other than the SEM, for example, an imaging device using charged particles such as ions.

Embodiment

FIG. 1 is a block diagram illustrating a configuration of the defect inspecting system according to the embodiment. In FIG. 1, 1 represents the defect inspecting system. The defect inspecting system 1 includes: a defect inspection device 2; and a host control device 3 that is connected to the defect inspection device 2 and executes a control of the defect inspection device 2. In the description of the embodiment, the defect inspection device 2 is the defect observation device.

The defect inspection device 2 includes various devices but is illustrated in FIG. 1 to include only devices required for the description. That is, the defect inspection device 2 includes a SEM 101 that acquires an image of a semiconductor wafer. The host control device 3 includes: a controller 102 that controls the entire defect inspection device 2; a storage medium device (storage unit) 103 including a magnetic disk, a semiconductor memory, or the like that stores information including a program; and an arithmetic unit 104 that executes an arithmetic operation in accordance with a program read from the storage unit 103. In addition, the host control device 3 includes: an external storage medium input/output unit (input/output IF) 105 that inputs and outputs information to and from a storage medium device 4 provided outside the host control device 3; a user interface controller (user IF) 106 that inputs and outputs information to and from a user; and a network interface group (network IF) 107 that controls communication between a defect image classification device or the like and the defect inspecting system 1 via a network.

The user inputs information to the defect inspecting system 1 using an input/output terminal 113 connected to the user IF 106, and checks information output from the defect inspecting system 1. The input/output terminal 113 is configured with, for example, a keyboard, a mouse, and a display. In addition, in FIG. 1, 5 represents the defect image classification device connected to the network IF 107. The results classified by the defect image classification device 5 are supplied to, for example, another host control device (not illustrated).

The arithmetic unit 104 is configured with, for example, a CPU (Central Processing Unit) and operates in accordance with a program from the storage unit 103. In addition, the controller 102 is configured with, for example, hardware or a CPU. When the controller 102 is configured with a CPU, the controller 102 also operates in accordance with a program from the storage unit 103. The storage unit 103 stores a program supplied from the storage medium device 4 and/or a network, for example, via the input/output IF 105 and/or the network IF 107. That is, the program that operates the CPU of the arithmetic unit 104 and the controller 102 is provided through the storage medium device 4 as a medium or is distributed via the network.

FIG. 1 illustrates a case where the single host control device 3 is provided. However, a plurality of host control devices 3 may be provided.

The SEM 101 configuring the defect inspection device 2 includes: a movable stage 109 on which a semiconductor wafer 108 as a sample is mounted; an electron source 110 for irradiating the semiconductor wafer 108 with an electron beam; a detector 111 that detects electrons (secondary electrons or reflection electrons) generated from the semiconductor wafer 108; an electron lens (not illustrated) that focuses the electron beam on the semiconductor wafer 108; and a deflector 112 that deflects the electron beam to scan the semiconductor wafer 108.

The controller 102, the storage unit 103, the arithmetic unit 104, the input/output IF 105, the user IF 106, and the network IF 107 are connected to a bus 114, and information detected by the detector 111 is supplied to the bus 114 and is processed by the arithmetic unit 104 or the like. The host control device 3 including the controller 102, the storage unit 103, the arithmetic unit 104, the input/output IF 105, the user IF 106, and the network IF 107 connected to the bus 114 can be considered as a computer (calculator). In this case, the movable stage 109, the deflector 112, the detector 111, and the like are controlled by the computer, and it can be considered that a defect observation process on the sample is implemented when information from the defect inspection device 2 is processed by the computer executing a program.

FIG. 2 is a diagram illustrating a configuration that is implemented by the controller, the storage unit, and the arithmetic unit according to the embodiment. The controller 102 and the arithmetic unit 104 operate in accordance with the program read from the storage unit 103 illustrated in FIG. 1, and the device illustrated in FIG. 2 is configured (implemented) with the controller 102 and the arithmetic unit 104. In addition, by the controller 102 and the arithmetic unit 104 operating in accordance with the program, three storage units are formed in the storage unit 103 as illustrated in FIG. 2.

Next, the device implemented with the controller 102 and the arithmetic unit 104 and the storage units formed in the storage unit 103 will be described.

In accordance with the program, a stage controller 201, an electron beam scanning controller 202, and a detector controller 203 are configured in the controller 102.

The stage controller 201 is a control unit that executes a control such that the movable stage 109 (FIG. 1) moves or stops.

The electron beam scanning controller 202 is a control unit that controls the deflector 112 (FIG. 1) such that a region in a predetermined field of view is irradiated with an electron beam.

The detector controller 203 is a control unit that samples a signal from the detector 111 (FIG. 1) in synchronization with the scanning of the electron beam, adjusts a gain, an offset, and the like of the sampled signal, and generates a digital image.

In the storage unit 103, an image storage unit 204, a process parameter storage unit 205, and an observation coordinate storage unit 206 are formed.

The image storage unit 204 is a storage unit that stores the digital image generated by the detector controller 203 together with supplementary information and stores an image generated by the arithmetic unit 104.

The process parameter storage unit 205 is a storage unit that stores conditions (imaging conditions) at the time of imaging in the SEM 101, process parameters used for defect detection, and the like.

The observation coordinate storage unit 206 is a storage unit that stores defect coordinates and the like of an input observation target.

In accordance with the program, a comparison inspection unit 207, a pseudo defect image generator 208, an image quality enhancer 209, a defect discriminator 210, and a process parameter adjuster 211 are configured in the arithmetic unit 104.

The comparison inspection unit 207 is a detection functional unit that detects a defect site in an inspection image.

The pseudo defect image generator 208 is a pseudo defect image generation functional unit that edits a partial region of an acquired image to generate a pseudo defect image.

The image quality enhancer 209 is an image quality enhancement functional unit that enhances the image quality of an acquired image. It is presumed that the image quality of the acquired image decreases depending on the resolution or SNR of the imaging device such as the SEM. Therefore, although described below, the image quality is enhanced by the image quality enhancement functional unit.

The defect discriminator 210 is a discrimination functional unit that discriminates between a defect site and a nuisance caused by, for example, a manufacturing tolerance.

The process parameter adjuster 211 is a process parameter adjustment functional unit that automatically adjusts a process parameter relating to a defect detection process to be executed by the defect inspecting system 1. This process parameter is, for example, a threshold for determination of a defect.

FIG. 3 is diagrams schematically illustrating disposition of a detector in the SEM according to the embodiment. Here, a case where fives detectors 301 to 305 are mounted in the SEM 101 is illustrated. Of course, the number of detectors is not limited to 5 and may be more than or less than 5.

(A) of FIG. 3 is a projection drawing illustrating the SEM 101 when seen from an oblique direction, (B) of FIG. 3 is a plan view when seen from a z-axis direction, and (C) of FIG. 3 is a cross-sectional view when seen from a y-axis direction.

As illustrated in (A) of FIG. 3, the detectors 301 and 302 are arranged at positions A and B along the y-axis, and the detectors 303 and 304 are arranged at positions C and D along the x-axis. The detectors 301 to 304 are not particularly limited and are arranged on the same plane in the z-axis. The detector 305 is disposed at a position E more distant from the semiconductor wafer 108 than the plane in the z-axis where the detectors 301 to 304 are disposed. (B) and (C) of FIG. 3 do not illustrate the detector 305.

The detectors 301 to 304 represent a plurality of detectors that are disposed such that they can selectively detect electrons having a predetermined emission angle (an elevation angle and an azimuth angle). That is, the detector 301 can detect electrons emitted from the semiconductor wafer 108 in an advancing direction of the y-axis (direction of an arrow), and the detector 302 can detect electrons emitted from the semiconductor wafer 108 in a retreating direction of the y-axis (reversed direction with respect to the arrow). Likewise, the detector 304 can detect electrons emitted in an advancing direction of the x-axis, and the detector 303 can detect electrons emitted in an retreating direction of the x-axis. As a result, an image that is contrasted such that each of the detectors is irradiated with light from the opposite direction can be acquired. The detector 305 functions as a detector that detects electrons mainly emitted from the semiconductor wafer 108. This way, by disposing the detectors along the different axes, the contrasted image can be acquired. The present invention is not limited to this disposition, and the detectors may be disposed at different positions from those of FIG. 3.

FIG. 4 is a diagram schematically illustrating defect coordinates in a semiconductor wafer detected by a detection device. Defect coordinates detected by another inspection device (hereinafter, also referred to as "preliminary inspection device") are supplied to the defect inspecting system 1. FIG. 4 illustrates the defect coordinates detected by the preliminary inspection device.

In FIG. 4, WW represents a semiconductor wafer, and DI represents a die (semiconductor chip). In addition, x represents the defect coordinates detected by the preliminary inspection device. When seen from the defect inspecting system 1, x represents observation coordinates of an observation target.

The defect inspecting system according to the embodiment has a function of automatically collecting a high-definition image of a defect site based on the defect coordinate from the preliminary inspection device. In this case, the defect coordinate supplied from the preliminary inspection device includes an error. Therefore, in the defect inspecting system 1, an image (inspection image) is acquired in a wide field of view centering on the defect coordinate supplied from the preliminary inspection device, a defect site is redetected, and the redetected defect site is imaged at a high magnification to acquire an observation image.

As illustrated in FIG. 4, a plurality of dies DI are formed in the semiconductor wafer WW. Therefore, for example, when another die DI adjacent to a die having a defect site is imaged, an image of a good die DI not including a defect site can be acquired. Although described below, in the defect detection process of the defect inspecting system 1, the shade of the inspection image is compared to that of the image of the good die DI as a reference image, and a site having a difference in shade is detected as a defect site. A threshold that determines the difference in shade for the determination of the defect site is an example of the process parameter in the defect detection process.

Process Parameter Adjustment of Defect Detection Process

Next, a process parameter automatic adjustment method of the defect detection process that is executed by the defect inspecting system 1 will be described. First, the entirety of the process parameter automatic adjustment method will be described using the drawings. Next, each of steps that are executed in the process parameter automatic adjustment method will be described in detail. The respective steps described below are executed by the comparison inspection unit 207, the pseudo defect image generator 208, the image quality enhancer 209, the defect discriminator 210, and the process parameter adjuster 211 configuring the arithmetic unit 104 illustrated in FIG. 2. In addition, when the steps are executed, the storage unit 103 and the controller 102 illustrated in FIG. 2 are also used. For example, when the steps are executed, information generated in the steps are stored in the storage unit 103, and information required in the steps are read from the storage unit 103.

FIG. 5 is an overall flowchart illustrating processes of the process parameter automatic adjustment method according to the embodiment.

In Step S500_S, the parameter automatic adjustment starts. Next, in Step S501, the semiconductor wafer is imaged to acquire a set (image set) including images used for adjusting the process parameter. In order to adjust the process parameter, the inspection image and the reference image are used as described above. Therefore, in Step S501, these images are acquired as the set.

After Step S501, Step S502 is executed. In Step S502, automatic adjustment of a parameter relating to an image quality enhancement process that is executed by the image quality enhancer 209 illustrated in FIG. 2 is executed.

Next, in Step S503, a pseudo defect image is generated using the pseudo defect image generator 208 illustrated in FIG. 2, and the process parameter is adjusted using the pseudo defect image. Although described below, in Step S503, a pseudo defect site generated by the pseudo defect image generator 208 is stored, and a process parameter with which the pseudo defect site is detectable is searched for. The process parameter is adjusted such that the pseudo defect site is detectable with the process parameter. In the process parameter automatic adjustment using the pseudo defect that is executed in Step S503, the process parameter is adjusted such that the pseudo defect site is detectable in consideration of noise in the acquired image, for example, shot noise and edge roughness, surface roughness, and the like of a circuit pattern.

However, in the process parameter adjusted in Step S503, an actual defect site is not always detectable. Accordingly, in the embodiment, the process parameter adjusted using the pseudo defect is set as an initial process parameter, and the process parameter is adjusted using the inspection image based on the initial process parameter in Step S504 (the process parameter automatic adjustment using the inspection image). As a result, a final process parameter is acquired. That is, the process parameter adjusted in Step S503 is set as an initial value, the process parameter is adjusted using this initial value in Step S504, and thus the final process parameter is acquired.

Next, the process parameter automatic adjustment process ends in Step S500_E. The final process parameter acquired in Step S504 is used in the defect observation process on another semiconductor wafer.

Image Set Acquisition Step S501

FIG. 6 is a flowchart illustrating processes that are executed in an image set acquisition step according to the embodiment. In the process parameter automatic adjustment method according to the embodiment, an inspection image including a defect site and two reference images not including a defect site are used.

In Step S501_S, the image set acquisition step S501 starts. Next, for a die DI (FIG. 4) including a defect site and two dies DI not including a defect site, images of a sampled observation coordinate point i for adjustment are acquired. Here, the image of the die including a defect site is set as the inspection image, and the images of the dies not including a defect site are set as the reference images.

In Step S601, an image at the observation coordinate i for adjustment is acquired for one of the two dies not including a defect site. The image acquired in Step S601 is set as a first reference image Ri1 at the observation coordinate i for adjustment. In addition, in Step S602, an image at the observation coordinates i for adjustment for the remaining one of the two dies not including a defect site is acquired as a second reference image Ri2. Further, in Step S603, an image at the observation coordinate i for adjustment is acquired for the die including a defect site. The image acquired in Step S603 is set as an inspection image Ti at the observation coordinate i for adjustment.

Next, in Step S604, comparison inspection of comparing the inspection image Ti and, for example, the first reference image Ri1 is executed to detect the defect site from the inspection image. In Step S605, an image of high magnification (high magnification image) Hi of the defect site detected in Step S604 is acquired.

Steps S600_RS and S600_RE represent that Steps S601 to S605 interposed between Step S600_RS and Step S600_RE are repeatedly executed while changing the observation coordinate i for adjustment from 1 to N. That is, Steps S600 to S605 are repeatedly executed while changing the observation coordinate i for adjustment from 1 to N.

After the step where the observation coordinate i for adjustment is N ends, Step S501_E is executed, and the image set acquisition step ends.

In the image set acquisition step S501, the process parameter is not adjusted. Therefore, a preset default process parameter is used. For example, in Step S604, a default process parameter is used as the process parameter for determining the threshold during the comparison inspection. Since the default process parameter is used, there may be a case where a high defect detection rate cannot be obtained. However, the high magnification image Hi acquired herein is used for the parameter adjustment of the image quality enhancement process that is executed in Step S502 described below, and does not need to include a defect.

The dies for which the first reference image and the second reference image are acquired may be dies that do not include a defect site and are disposed at different positions in the semiconductor wafer.

Image Quality Enhancement Process Parameter Adjustment Step S502

FIG. 7 is a diagram illustrating the image quality enhancement process parameter adjustment step according to the embodiment.

In the image quality enhancement process according to the embodiment, a correspondence between an image having a low image quality and an image having a high image quality is machine-learned, and an image having a high image quality is estimated from an image having a low image quality. Here, among the inspection images acquired in the image set acquisition step S501, for example, the high magnification image Hi acquired in Step S605 is processed to generate an image having an enlarged imaging field of view. This image having an enlarged imaging field of view is used as the image having a low image quality (low-quality image). On the other hand, the high magnification image acquired in Step S605 is used as the image having a high image quality (high-quality image). Each of the low-quality image and the high-quality image has a region that is considered as the same defect site. The low-quality image is processed such that the imaging field of view is enlarged. Therefore, for example, the low-quality image is more blurred than the high-quality image.

As a method of implementing machine learning, well-known deep learning is used. Specifically, a convolution neural network may be used. A specific example will be described using FIG. 7. FIG. 7 illustrates an example where a neural network having a three-layer structure is used.

In FIG. 7, Y represents a low-quality image to be input, and F(Y) represents an estimation result of a high-quality image. In addition, in the same drawing, F1(Y) and F2(Y) represent intermediate data between the input and the estimation result. The intermediate data F1(Y) and F2(Y) and the estimation result F(Y) are calculated from Expressions (1) to (3). Here, represents a convolution operation, W1 represents n1 filters having a size of c0×f1×f1, c0 represents the number of channels in the input image, and f1 represents the size of a spatial filter.

By convolving the filter having a size of c0×f1×f1 n1 times with the input image Y, an n1-dimensional feature map is obtained. B1 represents a n1 dimensional vector which is a bias component corresponding to n1 filters. Likewise, W2 represents a filter having a size of n1×f2×f2, B2 represents a n2 dimensional vector, W3 represents a filter having a size of n2×f3×f3, and B3 represents a c3 dimensional vector.

$$F1(Y) = \max(0, W1*Y+B1) \qquad \text{Expression (1)}$$

$$F2(Y) = \max(0, W2*F1(Y)+B2) \qquad \text{Expression (2)}$$

$$F(Y) = W3*F2(Y)+B3 \qquad \text{Expression (3)}$$

c0 and c3 described above are values that are determined depending on the numbers of channels in the low-quality image and the high-quality image. In addition, f1,f2, n1, and n2 are hyperparameters that are determined by the user before a learning sequence. For example, f1=9, f2=5, n1=128, and n2=64 may be satisfied.

In Step S502 of the image quality enhancement process parameter adjustment, the parameters to be adjusted are W1, W2, W3, B1, B2, and B3. By setting the low-quality image having an enlarged imaging field of view as the input and setting the high-quality image as the estimation result, the parameters (W1, W2, W3, B1, B2, and B3) are adjusted, and a parameter where the estimation result conforms to that of the high-quality image is acquired as the result of the adjustment. Hereinafter, the parameter to be adjusted in the image quality enhancement process parameter adjustment will also be referred to as "image quality enhancement process parameter".

In the image quality enhancement process parameter adjustment, general error backpropagation may be used for the learning of the neural network. In addition, in order to calculate an estimated error, all of the acquired image pairs for learning (the low-quality image and the high-quality image) may be used, but a mini batch type may be adopted. That is, a process of randomly selecting a plurality of images from the image pairs for learning and updating the image quality enhancement process parameter may be repeatedly executed. Further, a batch image may be randomly cut from one image pair for learning and may be set as the input image Y of the neural network. As a result, the learning is efficiently executed. As the configuration of the convolution neural network described above, another configuration may be used. For example, the number of layers may be changed, a network including four or more layers may be used, or a configuration including skip connection may be adopted.

Process Parameter Automatic Adjustment Step S503 Using Pseudo Defect Image

FIG. 8 is a flowchart illustrating processes that are executed in the process parameter automatic adjustment step using the pseudo defect image according to the embodiment.

In Step S503_S, the step of the parameter automatic adjustment using the pseudo defect image starts.

In Step S801, an application region Pi of the pseudo defect is set for the observation coordinate point i for adjustment. A center position and a size (width and height) of the application region Pi may be randomly set in a plane of the acquired image. For example, the application region Pi of the pseudo defect is set in a region of the acquired image that is designated by the observation coordinate point i for adjustment.

Next, in Step S802, the image in the application region Pi of the first reference image Ri1 acquired in the image set acquisition step S501 is edited. Through this image editing, the pseudo defect (pseudo defect shade) is applied to the application region Pi, and the image to which the pseudo defect is applied is stored as a pseudo defect image Fi.

Steps S801 and S802 interposed between Step S800_RS and Step S800_RE are repeatedly executed while changing the observation coordinate i for adjustment from 1 to N. As a result, for example, N pseudo defect images Fi are stored.

FIG. 9 is a diagram schematically illustrating examples of the pseudo defect image according to the embodiment. In FIG. 9, 901a and 901b are examples of the first reference image Ri1 to which the pseudo defect is not applied. Here, 901a represents the image that is detected by the detector 305 illustrated in FIG. 3, and 901b represents the image that is detected by the detector 301 illustrated in FIG. 3. 902a to 905a and 902b to 905b represent the pseudo defect images obtained by applying the pseudo defect to the reference images 901a and 901b.

A case where the image is edited such that a given offset as the pseudo defect is applied to the shade of a region PD as the application region Pi is illustrated in the pseudo defect images 902a and 902b. In addition, an example where the application region Pi (PD) is set to include an edge of a circuit pattern and is deformed is illustrated in the pseudo defect images 903a and 903b.

In addition, the defect shade may be generated by simulating characteristics (including disposition) of the detector. For example, in the pseudo defect images 904a and 904b, a low level difference defect is simulated. That is, the application region PI (PD) is set only in the pseudo defect image 904b to apply the pseudo defect thereto. This defect can be detected using the characteristics of the detector 301 that is disposed such that unevenness can be visualized. That is, as described using FIG. 3, the detector 301 can acquire an image opposite to electrons emitted from the x-axis direction. Therefore, a low level difference that is not likely to be detected in the image acquired by the detector 305 can also be visualized and detected as a defect shade by the detector 301. This pseudo defect may also be applied. In the above case, a small or low contrast defect is simulated. However, as illustrated in the pseudo defect images 905a and 905b, a large defect that covers the entire field of view may be generated. The type of the pseudo defect is not limited to these examples, and various defects may be modeled and generated.

Returning to FIG. 8, the description of the process parameter automatic adjustment using the pseudo defect image is continued. A set including the pseudo defect image Fi, the second reference image Ri2, and a process parameter $\theta j$ to be searched for stored in the storage unit 103 is supplied in Step S803. In Step S803, comparison inspection of comparing the pseudo defect image Fi and the second reference image Ri2 using the process parameter $\theta j$ is executed, and a defect region Oij is extracted.

Next, in Step S804, the concordance rates of the defect region Oij extracted in Step S803 and the pseudo defect region Pi in the pseudo defect image Fi are compared to determine whether or not the detection of the defect succeeds. In this case, for example, when the extracted defect region Oij and the pseudo defect region Pi overlap each other by a predetermined value or more, it is determined that the detection of the defect succeeds.

The process parameters $\theta j$ to be searched for are, for example, 1 to H, and these parameters are set as one process parameter set. In Step S800_jRS, for example, when the process parameter $\theta j$ is set to 1, Steps S803 and S804 interposed between Step S800_iRS and Step S_800_iRE are repeatedly executed while changing the observation coordinate point i for adjustment from 1 to N.

When Steps S803 and S804 are executed N times, Step S805 is executed after Step S800_iRE. In Step S805, a defect detection success rate is calculated with the process parameter $\theta i$ (i=1) used in Step S803.

Next, through Step S800_jRE, the process returns to Step S800_jRS, and the next process parameter $\theta j$ (for example, J=2) is selected from the process parameter set. Using this selected process parameter $\theta j$ (j=2), Steps S803 and 804 are repeatedly executed as in the case of the process parameter $\theta j$ (j=1).

When all of the process parameters in the process parameter set $\theta j$ are selected, Step S806 is executed after Step S800_jRE. In Step S806, a process parameter $\theta j$ having the highest defect detection success rate among the defect detection success rates corresponding to the process parameters $\theta j$ (j=1 to H) calculated in Step S805 is selected, and this process parameter $\theta j$ is output as an initial process parameter $\theta 1st$. Next, in Step S503_E, the step of the parameter automatic adjustment using the pseudo defect image ends.

Process Parameter Automatic Adjustment Step S504 Using Inspection Image

FIG. 10 is a flowchart illustrating processes that are executed in the process parameter automatic adjustment step using the inspection image according to the embodiment.

In Step S504_S, the process parameter automatic adjustment step using the inspection image starts.

The inspection image Ti, the second reference image Ri2, and the initial process parameter $\theta 1st$ stored in the storage unit 103 are supplied to Step S1001.

In Step S1001, comparison inspection of comparing the inspection image Ti and the second reference image Ri2 corresponding to the sampled observation coordinate i for adjustment using the initial process parameter $\theta 1st$ is executed, and M points as defect candidates are extracted. Specifically, the inspection image Ti and the second reference image Ri2 are compared to each other by using the initial process parameter $\theta 1st$ as a threshold to extract top M sites with high degree of abnormality in Step S1001. The initial process parameter $\theta 1st$ is the adjusted process parameter $\theta j$ with which the pseudo defect is detectable by the adjustment using the pseudo defect. Therefore, an actual defect site in the actual inspection image Ti is not always detectable. However, by extracting a plurality of points such as the M points as the defect candidates, it can be expected that the M points include the actual defect site. In other words, by acquiring the initial process parameter $\theta 1st$, the number of targets for extracting the actual defect site can be reduced, and the throughput relating to the detection can be reduced.

Next, Step S1002 is executed. In Step S1002, whether each of the extracted M points as the defect candidates is a defect or a nuisance caused by erroneous detection of a manufacturing tolerance is discriminated to extract an actual defect site Qi from the inspection image Ti with high accuracy. Step S1002 will be described below in detail using the drawings.

Step S1002 of Extracting Actual Defect Site by Defect Discrimination

FIG. 11 is a flowchart illustrating processes in the step of extracting the actual defect site by defect discrimination according to the embodiment. In addition, FIG. 12 is a schematic diagram illustrating the extraction of the actual defect site according to the embodiment.

In FIG. 12, 1201 illustrates a schematic plan view illustrating the acquired inspection image Ti. The inspection image Ti illustrates a case where defect candidates when M=3 are extracted in Step S1001 of FIG. 10. That is, in the inspection image 1201, regions 1202 to 1204 surrounded by broken lines represent regions extracted as defect candidate sites. In order to absorb an error generated in the defect inspection device 2 that acquires an image, the inspection image Ti is acquired such that the field of view is wide and the pixel size is large. In addition, in order to improve the throughput of the ADR, the number of times the semiconductor wafer 108 (FIG. 1) is scanned is small, and the number of frames added is small, and the SNR in the inspection image Ti is low. Therefore, it is difficult to discriminate a defect directly from the inspection image Ti with high accuracy.

In the embodiment, images of the defect candidate sites 1202 to 1204 are cut, the image quality enhancement process is executed on the cut defect candidate sites 1202 to 1204 to estimate high magnification images, and the actual defect site is discriminated using the estimated high magnification images. In this case, in the image quality enhancement process, the corresponding high magnification image is estimated from the defect candidate site using the image quality enhancement process parameter adjusted in the image quality enhancement process parameter adjustment step S502. As a result, a defect can be discriminated with high accuracy using an image having a high SNR.

In FIG. 12, 1205a to 1207a represent images of defect candidate sites having a low SNR obtained by cutting and enlarging the defect candidate sites 1202 to 1204. On the other hand, 1205b to 1207b represent estimated images of defect candidate sites having a high SNR obtained by cutting the defect candidate sites 1202 to 1204 and executing the image quality enhancement process thereon.

Next, the specific process that is executed in Step S1002 will be described using FIG. 11. In Step S1002_S, the step of extracting the actual defect site by defect discrimination starts.

In Step S1101, a high magnification image is estimated from the defect candidate site (region) through the image quality enhancement process. At this time, the high magnification image is estimated such that the center of the defect candidate region is the center of the estimated high magnification image. Since the image quality enhancement process is described above in Step S502, the details thereof will not be repeated. As the image quality enhancement process parameter used in Step S1101, the image quality enhancement process parameter adjusted in Step S502 is used. That is, the corresponding high magnification image can be automatically estimated based on the defect candidate site as an input using the image quality enhancement process parameter of the neural network that is learned in advance. As a result, the high magnification image that is more accurately estimated can be acquired, and the defect discrimination can be executed with higher accuracy.

In the embodiment, in the next Step S1102, the image quality enhancement process is executed on the second reference image Ri2 as described above. The conditions of the image quality enhancement process to be executed on the reference image Ri2 are the same as those of Step S1101, except that the reference image Ri2 is input instead of the defect candidate site and the high magnification image corresponding to the reference image Ri2 is output.

After Step S1102, Step S1103 is executed. In Step S1103, the high magnification image corresponding to the defect candidate site and the high magnification image corresponding to the reference image are compared to each other again, and the degree of abnormality is calculated again based on the result of the re-comparison inspection.

Steps S1100_RS and S1100_RE represent that Steps S1101 to S1103 interposed between the two steps are repeated M (=3) times. As a result, the degree of abnormality corresponding to each of the M points is acquired.

In Step S1104, the highest degree of abnormality is selected from the M degrees of abnormality corresponding to the M points, and the defect candidate site corresponding to the selected degree of abnormality is discriminated and output as the actual defect site Qi.

Next, in Step S1002_E, the step of extracting the actual defect site by defect discrimination ends.

In the embodiment, the example where the image quality enhancement process is executed on the defect candidate site and the reference image to generate the high magnification images corresponding thereto is described. However, the high magnification image corresponding to the defect candidate site or the reference image may be generated. However, by generating the high magnification images of the defect candidate site and the reference image, the high magnification images having a high SNR can be compared, and thus a more accurate degree of abnormality can be calculated.

Returning to FIG. 10, the description of the process that is executed in the process parameter automatic adjustment step using the inspection image is continued.

In FIG. 10, Steps 1000_RS and S1000_RE represent that Steps S1001 and S1002 interposed between the steps are repeated while changing the observation coordinate point i for adjustment from 1 to N. As a result, the actual defect site Qi corresponding to each of the observation coordinate points i for adjustment (i=1 to N) is extracted.

After the actual defect site Qi is extracted, a process of searching for the process parameter θj used in the defect inspecting system 1 (FIG. 1) from the set including the process parameters θj is executed through Steps S1003 to S1006, S1000_jRS, S1000_iRS, S1000_jRE, and S1000_jRE. This process is similar to the process parameter adjustment using the pseudo defect image described using FIG. 8. That is, Steps S1003 to S1006, S1000_jRS, S1000_iRS, S1000_jRE, and S1000_jRE illustrated in FIG. 10 are similar to Steps S803 to S806, S800_jRS, S800_iRS, S800_jRE, and S800_jRE illustrated in FIG. 8. A main difference is that the inspection image Ti is used instead of the pseudo defect image Fi.

The process that is executed through Steps S1003 to S1006, S1000_jRS, S1000_iRS, S1000_jRE, and S1000_jRE illustrated in FIG. 10 is simply described as follows.

The defect region Oij is detected by executing the comparison inspection on each of the inspection images Ti (i=1 to N) and the second reference image Ri2 (i=1 to N) using the set including the preset process parameters θj (j=1 to H) to be searched for. The concordance rates of the detected region Oi and the actual defect site Qi are compared to determine whether or not the detection of the actual defect succeeds. After repeating the above process for all of the inspection images Ti (i=1 to N), the defect detection success rates of the process parameters θj are calculated. The process parameter θj having the highest defect detection success rate is output as the final process parameter from the set including the process parameters θj (j=1 to H) to be searched for.

After outputting the final process parameter, the process parameter automatic adjustment step using the inspection image ends in Step S504_E.

The output final process parameter is stored in the storage unit 103 and is shared when another semiconductor wafer is inspected. That is, in the defect inspecting system, for example, when 100 semiconductor wafers are inspected, the final process parameter is acquired using one semiconductor wafer, and subsequently the remaining 99 semiconductor wafers are inspected based on this final process parameter. In other words, the comparison inspection on the reference image and the inspection image is executed based on the common final process parameter as a threshold for a plurality of semiconductor wafers.

In the embodiment, the process parameter is automatically adjusted to the final process parameter without intervention of the user. The final process parameter obtained by the adjustment is the process parameter with which the actual defect site or a site close to the actual defect site is detectable by comparison inspection. Therefore, for example, the actual defect site or a site close to the actual defect site in each of 100 semiconductor wafers can be detected by the defect inspecting system 1, and an image of the actual defect site or a site close to the actual defect site can be automatically acquired.

Although described above, each of the steps is implemented with the configuration in the arithmetic unit 104 illustrated in FIG. 2. An example of a correspondence between the process in the step and the configuration in the arithmetic unit 104 is described as follows.

The pseudo defect image generator 208 functions to generate a pseudo defect image by editing a reference image such that the edited reference image includes a pseudo defect site. The initial parameter adjuster 211 functions to determine an initial parameter with which the pseudo defect site is detectable from the pseudo defect image, and functions to determine a process parameter with which a site close to the specified actual defect site is detectable. In addition, the comparison inspection unit 207 functions to execute a comparison such that a defect candidate site is acquired using the process parameter from the inspection image acquired to include the defect site. The image quality enhancer 209 functions to estimate a high-quality image (high magnification image) from an image corresponding to the defect candidate site in each of the inspection image and the reference image. The defect discriminator 210 functions to specify an actual defect site in the inspection image by executing defect discrimination using the high-quality images.

In addition, when the image acquired in each of the steps is stored in the image storage unit 204 of the storage unit 103, the image stored in the image storage unit 204 is output in response to a request in the process of the step. Various parameters are read and written as described above between the process parameter storage unit 205 and the arithmetic unit 104. Further, the observation coordinate such as the defect coordinate detected by the preliminary inspector is read and written between the observation coordinate storage unit 206 and the arithmetic unit 104.

Operation by User

The user operates the defect inspecting system 1 according to the embodiment using the input/output terminal 113 illustrated in FIG. 1. In the embodiment, the user operates the defect inspecting system 1 via a GUI (Graphical User Interface).

FIG. 13 is a screen of a GUI relating to the parameter automatic adjustment using the pseudo defect image according to the embodiment. In an interface region 1301 of the screen, a list (ID) of pseudo defect images is displayed, and whether or not detection of a pseudo defect in each of the pseudo defect images succeeds (detection) is displayed. In addition, in an interface region 1302, the selected pseudo defect image (ID=F000003) is displayed. In FIG. 13, a region PD surrounded by a broken line in the interface region 1302 represents a pseudo defect site.

In an interface region 1303, the adjusted process parameter is displayed. In addition, by changing a slider of the interface region 1303, the process parameter can be manually adjusted. In the example of FIG. 13, the process parameters are #1 to #6, and one of the process parameters is a threshold used for comparison inspection.

In an interface region 1304, a button of calling up a GUI where the parameter of the generated pseudo defect image is adjusted is displayed. In addition, an interface region 1305 is a button for manually calling up the process parameter automatic adjustment using the generated pseudo defect image (the process of Steps S803 to S804 and the process of Steps S805 and S806). An interface region 1306 is a button for evaluating the defect detection success rate when the parameter that is manually adjusted in the interface region 1303 is used.

FIG. 14 is a screen of a GUI relating to the process parameter automatic adjustment using the inspection image according to the embodiment. In an interface region 1401, a list (ID) of inspection images is displayed, and whether or not detection of an actual defect in the inspection image succeeds (Run1, Run2) is displayed. In an interface region 1402, the selected inspection image (ID=000003) and the detected actual defect region are displayed. In the example of FIG. 14, a region PD surrounded by a broken line represents a region of an actual defect.

In an interface region 1403, the adjusted process parameter is displayed, and by changing a slider, the parameters (#1 to #6) can be manually adjusted. Here, one process parameter is a threshold used for comparison inspection.

In addition, an interface region 1404 is a button for manually calling up the process of automatically extracting a region of an actual defect (process in Steps S1001 to S1002), an interface region 1405 is a button for adding a region of an actual defect, and an interface region 1406 is a button for deleting a region of an actual defect.

An interface region 1407 is a button for manually calling up the parameter automatic adjustment process using an actual defect, and an interface region 1408 is a button for evaluating the defect detection success rate when the parameter that is manually adjusted in the interface region 1403 is used.

FIG. 15 is a screen of a GUI for adjusting a parameter relating to generation of the pseudo defect image according to the embodiment. By clicking the button of the interface region 1304 illustrated in FIG. 13, the screen of the GUI illustrated in FIG. 15 is called up. The GUI screen of FIG. 15 includes an interface region (generator ID designation) for designating an ID of a reference image used for the generation and an interface region (generated pseudo defect option) for designating the type of the generated defect.

As described above, according to the embodiment, the user does not instruct a defect site, and in any semiconductor wafer to be observed, a process parameter of the defect detection process can be fully automatically adjusted. As a result, the workload of the user relating to the process parameter adjustment can be reduced, and the usability of the device can be improved. In addition, the adjustment result of the process parameter does not depend on the skill level of the user. Therefore, a high defect detection rate can be stably obtained. In addition, a defect can be detected with higher accuracy without depending on SNR.

In the embodiment, the example of executing both of Step S503 of the process parameter automatic adjustment using the pseudo defect image and Step S504 of the process parameter automatic adjustment using the inspection image as illustrated in FIG. 5 is described. However, the present invention is not limited to this example. That is, only any one of Step S503 or S504 may be executed. For example, when Step S504 is not executed, the adjusted process parameter acquired in Step S503 may be used as the final process parameter. In addition, when Step S503 is not executed, for example, a parameter set by the user may be considered as the process parameter adjusted in Step S503. As a result, the number of steps can be reduced, and the period of time can be reduced. However, by executing both of the steps, a defect can be detected with higher accuracy. Therefore, it is desirable to execute Steps S503 and S504.

The comparison inspection unit 207, the pseudo defect image generator 208, the product quality enhancer 209, the defect discriminator 210, and the process parameter adjuster 211 provided in the arithmetic unit 104 illustrated in FIG. 2 are implemented by the arithmetic unit 104 illustrated in FIG. 1 executing the corresponding program. This program may be stored in the storage medium 4 (FIG. 1) such as a magnetic memory or a semiconductor memory to be provided as the storage medium 4, or may be distributed from another calculator via network using a program distribution server. Of course, some or all of the comparison inspection unit 207, the pseudo defect image generator 208, the image quality enhancer 209, the defect discriminator 210, and the process parameter adjuster 211 may be implemented with hardware instead of the program. By implementing the functions with the program, a general-purpose device can be used. The program distribution server may be a calculator including: a storage medium that stores the program executing the above-described process; a network IF that is connected to the above-described network; and a CPU that transmits the program stored in the storage medium to another calculator via the network IF.

The present invention is not limited to the embodiments and includes various modification examples. In addition, the embodiments have been described in detail in order to easily describe the present invention, and the present invention is not necessarily to include all the configurations described above. Each member illustrated in the drawings is simplified and idealized to easily understand the present invention, and have a more complicated configuration in practice. In addition, the host control device may be a calculator. This calculator does not need to be always communicable with the defect inspection device. For example, the calculator may receive an image via a USB memory or another calculator. Further, even when the determined parameter is input to the defect inspection device, the calculator may directly set the parameter in the defect inspection device. However, by displaying the parameter on a user interface of the calculator, the user of the defect inspection device may set the parameter. In the display process of the user interface, the user interface may be displayed by another calculator such as a mobile calculator or a process for this display may be executed.

REFERENCE SIGNS LIST

1: defect inspecting system
2: defect inspection device
3: host control device
101: SEM
102: controller
103: storage unit
104: arithmetic unit
108: semiconductor wafer
111, 301 to 305: detector
207: comparison inspection unit
208: pseudo defect image generator
209: image quality enhancer
210: defect discriminator
211: process parameter adjuster
Fi: pseudo defect image
Hi: high magnification image
Ri1, Ri2: reference image
S500: process parameter automatic adjustment step
S501: image set acquisition step
S502: image quality enhancement process parameter adjustment step
S503: parameter automatic adjustment step using pseudo defect image
S504: process parameter automatic adjustment step using inspection image
Ti: inspection image

The invention claimed is:

1. A defect inspecting system comprising:
a defect inspection device including a detector configured to image a sample; and
a host control device,
wherein the host control device
causes the defect inspection device to acquire an inspection image including a defect and causes the defect inspection device to acquire a plurality of reference images not including a defect site,
generates a pseudo defect image by editing a predetermined reference image among the plurality of acquired reference images such that the edited reference image includes a pseudo defect site,
determines an initial parameter with which the pseudo defect site is detectable from the pseudo defect image,
acquires a defect candidate site from the inspection image using the initial parameter,
estimates a high-quality image from an image of a site corresponding to the defect candidate site in each of the inspection image and the reference image, specifies an actual defect site in the inspection image by executing defect discrimination using the estimated high-quality images in the inspection image and the reference image, and determines a parameter with which a site close to the specified actual defect site is detectable.

2. The defect inspecting system according to claim 1, wherein when the initial parameter is determined, the host control device compares a pseudo defect site that is applied at the time of generating the pseudo defect image to a defect site that is detected by executing comparison inspection on the pseudo defect image and the reference image according to a parameter, determines that detection of a defect succeeds when the pseudo defect site and the detected defect site overlap each other by a predetermined value or more, and determines a parameter having a highest defect detection success rate as the initial parameter while changing the parameter.

3. The defect inspecting system according to claim 1, wherein the host control device estimates the high-quality image using a neural network that is learned to estimate a high-quality image from a low-quality image in advance.

4. The defect inspecting system according to claim 1, wherein during the defect discrimination, the host control device calculates a degree of abnormality by comparing the estimated high-quality image in the inspection image and the estimated high-quality image in the reference image, and specifies a site where the calculated degree of abnormality is the highest as the actual defect site.

5. A defect inspecting method comprising:

an image acquisition step of acquiring an inspection image including a defect and acquiring a plurality of reference images not including a defect site;

a pseudo defect image generation step of generating a pseudo defect image by editing a predetermined reference image acquired in the image acquisition step such that the edited reference image includes a pseudo defect site;

an initial parameter adjustment step of determining an initial parameter with which the pseudo defect site is detectable from the pseudo defect image;

a defect candidate inspection step of acquiring a defect candidate site from the inspection image using the initial parameter;

an image quality enhancement step of estimating a high-quality image from an image of a site corresponding to the defect candidate site in each of the inspection image and the reference image;

a defect discrimination step of specifying an actual defect site in the inspection image by executing defect discrimination using the high-quality images in the inspection image and the reference image that are estimated in the image quality enhancement step; and a parameter adjustment step of determining a parameter with which a site close to the specified actual defect site is detectable.

6. The defect inspecting method according to claim 5, the initial parameter adjustment step includes:

a comparison step of comparing a site to which a pseudo defect is applied in the pseudo defect image generation step to a defect site that is detected by executing comparison inspection on the pseudo defect image and the reference image according to a parameter; and a determination step of determining that detection of a defect succeeds when regions of both of the sites overlap each other by a predetermined value or more in the comparison step, wherein while changing the parameter used in the comparison inspection in the comparison step, the determination in the determination step is executed to search for a parameter having a highest defect detection success rate from the parameters used in the comparison step, and the parameter having the highest defect detection success rate is determined as the initial parameter.

7. The defect inspecting method according to claim 5, wherein in the image quality enhancement step, the high-quality image is estimated using a neural network that is learned to estimate a high-quality image from a low-quality image in advance.

8. The defect inspecting method according to claim 5, wherein the defect discrimination step includes an arithmetic operation step of calculating a degree of abnormality by comparing the high-quality image in the inspection image that is estimated in the image quality enhancement step and the high-quality image in the reference image that is estimated in the image quality enhancement step, and in the inspection image, a site having a highest degree of abnormality is specified as the actual defect site.

9. A program causing a calculator to execute the defect inspecting method according to claim 5.

* * * * *